United States Patent
Obweger et al.

(10) Patent No.: US 9,597,701 B2
(45) Date of Patent: Mar. 21, 2017

(54) APPARATUS FOR TREATING SURFACES OF WAFER-SHAPED ARTICLES

(71) Applicant: LAM RESEARCH AG, Villach (AT)

(72) Inventors: Rainer Obweger, Lind/Dr. (AT);
Andreas Gleissner, Dobriach (AT);
Philipp Engesser, Lindau/Bodensee (DE)

(73) Assignee: LAM RESEARCH AG, Villach (AT)

( * ) Notice: Subject to any disclaimer, the term of this patent is extended or adjusted under 35 U.S.C. 154(b) by 399 days.

(21) Appl. No.: 14/145,241

(22) Filed: Dec. 31, 2013

(65) Prior Publication Data

US 2015/0187629 A1    Jul. 2, 2015

(51) Int. Cl.

| | | |
|---|---|---|
| *B05B 13/02* | (2006.01) | |
| *H01L 21/67* | (2006.01) | |
| *H01L 21/687* | (2006.01) | |
| *C23C 14/50* | (2006.01) | |
| *C30B 25/14* | (2006.01) | |
| *C23C 16/458* | (2006.01) | |
| *C30B 25/12* | (2006.01) | |

(52) U.S. Cl.
CPC ...... *B05B 13/0228* (2013.01); *H01L 21/6719* (2013.01); *H01L 21/67103* (2013.01); *H01L 21/68785* (2013.01); *H01L 21/68792* (2013.01); *C23C 14/505* (2013.01); *C23C 16/4584* (2013.01); *C30B 25/12* (2013.01); *C30B 25/14* (2013.01)

(58) Field of Classification Search
CPC ........... B05B 13/0228; H01L 21/67103; H01L 21/68785; H01L 21/68792; H01L 21/6719; C23C 14/505; C23C 16/4584; C30B 25/12; C30B 25/14
USPC ......... 118/715, 728, 50; 156/345.29, 345.33, 156/345.34, 345.36, 345.51
See application file for complete search history.

(56) References Cited

U.S. PATENT DOCUMENTS

| | | | |
|---|---|---|---|
| 4,903,717 A | 2/1990 | Sumnitsch | |
| 4,928,626 A * | 5/1990 | Carlson | C23C 16/455 117/101 |
| 5,229,081 A * | 7/1993 | Suda | C23C 16/455 118/620 |
| 5,513,668 A | 5/1996 | Sumnitsch | |
| 5,871,586 A * | 2/1999 | Crawley | C23C 16/45514 118/715 |
| 6,403,491 B1 * | 6/2002 | Liu | H01J 37/32522 257/E21.252 |
| 6,428,847 B1 * | 8/2002 | Grant | C23C 16/455 118/715 |

(Continued)

FOREIGN PATENT DOCUMENTS

WO    2007/101764    9/2007

*Primary Examiner* — Rudy Zervigon

(57) ABSTRACT

An apparatus for processing wafer-shaped articles comprises a closed process chamber providing a gas-tight enclosure. A rotary chuck is located within the closed process chamber, and is adapted to hold a wafer shaped article thereon. A lid is secured to an upper part of the closed process chamber. The lid comprises an annular chamber, gas inlets communicating with the annular chamber and opening on a surface of the lid facing outwardly of the closed process chamber, and gas outlets communicating with the annular chamber and opening on a surface of the lid facing inwardly of the closed process chamber.

9 Claims, 3 Drawing Sheets

(56) References Cited

U.S. PATENT DOCUMENTS

| | | | |
|---|---|---|---|
| 6,432,259 B1* | 8/2002 | Noorbakhsh | H01J 37/321 118/723 E |
| 6,485,531 B1 | 11/2002 | Schob | |
| 6,716,302 B2* | 4/2004 | Carducci | H01J 37/32522 118/715 |
| 6,746,565 B1* | 6/2004 | Bleck | H01L 21/67075 156/345.12 |
| 6,884,296 B2* | 4/2005 | Basceri | C23C 16/45514 118/715 |
| 7,794,544 B2* | 9/2010 | Nguyen | C23C 16/0272 118/715 |
| 8,291,857 B2* | 10/2012 | Lam | C23C 16/4412 118/715 |
| 8,382,939 B2* | 2/2013 | Kutney | H01J 37/3244 118/50 |
| 8,778,079 B2* | 7/2014 | Begarney | C23C 16/45508 118/715 |
| 9,032,906 B2* | 5/2015 | Ma | C23C 16/18 118/715 |
| 2003/0037880 A1* | 2/2003 | Carducci | H01J 37/32522 156/345.43 |
| 2003/0047202 A1* | 3/2003 | Worm | B08B 7/0021 134/157 |
| 2003/0124820 A1* | 7/2003 | Johnsgard | C23C 16/455 438/482 |
| 2004/0028810 A1* | 2/2004 | Grant | C23C 16/4412 427/248.1 |
| 2004/0035358 A1* | 2/2004 | Basceri | C23C 16/45514 118/715 |
| 2005/0000423 A1* | 1/2005 | Kasai | C23C 16/45565 118/715 |
| 2007/0110895 A1* | 5/2007 | Rye | H01L 21/67051 427/240 |
| 2007/0119370 A1* | 5/2007 | Ma | C23C 16/18 118/723 E |
| 2008/0011334 A1* | 1/2008 | Rye | H01L 21/67051 134/95.1 |
| 2009/0095221 A1* | 4/2009 | Tam | C23C 16/45565 118/715 |
| 2009/0095222 A1* | 4/2009 | Tam | C23C 16/45565 118/723 R |
| 2009/0105385 A1* | 4/2009 | Park | B82Y 30/00 524/406 |
| 2009/0130794 A1* | 5/2009 | Probst | C23C 14/243 438/84 |
| 2010/0024727 A1* | 2/2010 | Kim | C23C 16/45565 118/715 |
| 2010/0212591 A1* | 8/2010 | He | C23C 16/4412 118/715 |
| 2010/0294199 A1* | 11/2010 | Tran | C23C 16/4401 118/723 R |
| 2011/0162800 A1* | 7/2011 | Noorbakhsh | C23C 16/45565 156/345.34 |
| 2011/0201181 A1* | 8/2011 | Tanaka | C23C 16/303 438/478 |
| 2012/0027936 A1* | 2/2012 | Gurary | C23C 16/4407 427/255.5 |
| 2012/0309204 A1* | 12/2012 | Kang | H01J 37/3244 438/719 |
| 2013/0062839 A1 | 3/2013 | Tschinderle et al. | |
| 2013/0098477 A1* | 4/2013 | Yudovsky | F17D 3/00 137/507 |
| 2013/0134128 A1* | 5/2013 | Tschinderle | H01L 21/67051 216/58 |
| 2014/0209027 A1* | 7/2014 | Lubomirsky | B05B 1/005 118/724 |
| 2014/0227883 A1* | 8/2014 | Izumoto | H01L 21/6708 438/745 |
| 2015/0187568 A1* | 7/2015 | Pettinger | H01J 37/3244 118/708 |
| 2015/0187612 A1* | 7/2015 | Obweger | H01L 21/67109 216/84 |
| 2015/0187624 A1* | 7/2015 | Gleissner | H01J 37/32467 156/345.23 |
| 2015/0187629 A1* | 7/2015 | Obweger | B05B 13/0228 118/730 |
| 2016/0064242 A1* | 3/2016 | Obweger | H01L 21/311 134/1.3 |

* cited by examiner

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

For many applications the closed process chamber needs to be purged with ozone or an inert gas such as nitrogen, prior to commencement of a given process, or between successive processes. Additionally, for many applications the process chambers also need to be cleaned, for example by rinsing with deionized water.

An improved design for closed chamber single wafer wet processing is described in commonly-owned copending application U.S. Pub. No. 2013/0134128, in which the lid for the chamber is equipped with a fluid distribution ring that is either resilient or maintained at a very small gap from the edge of the surrounding chamber wall. However, it has proven difficult in practice to assemble the chamber without damaging the edge of the annular gap. Moreover, when the ring is made of a resilient material, it has been found that such material may expand during high temperature processing, thereby causing the gap to close partially and impair the purging function.

SUMMARY OF THE INVENTION

The present inventors have developed an improved apparatus for treating wafer-shaped articles, as well as an improved lid for use with such an apparatus.

Thus, in one aspect, the present invention relates to an apparatus for processing wafer-shaped articles, comprising a closed process chamber, the closed process chamber comprising a housing providing a gas-tight enclosure. A rotary chuck is located within the closed process chamber, and is adapted to hold a wafer shaped article thereon. A lid is secured to an upper part of the closed process chamber, the lid comprising an annular chamber, gas inlets communicating with the annular chamber and opening on a surface of the lid facing outwardly of the closed process chamber, and gas outlets communicating with the annular chamber and opening on a surface of the lid facing inwardly of the closed process chamber.

In preferred embodiments of the apparatus according to the present invention, the lid comprises an upper plate formed from a composite fiber-reinforced material and a lower plate that faces into the closed process chamber and is formed from a chemically-resistant plastic, the annular chamber being formed in the lower plate.

In preferred embodiments of the apparatus according to the present invention, the annular chamber is defined by a radially-inwardly extending groove formed in a lower region of the lid, and a ring that is fitted in an outer part of the groove so as to close the annular chamber.

In preferred embodiments of the apparatus according to the present invention, the annular chamber is defined by a radially-inwardly extending groove formed in a peripheral region of the lower plate, and a ring that is fitted in an outer part of the groove so as to close the annular chamber.

In preferred embodiments of the apparatus according to the present invention, the lower region of the lid and the ring are each formed from a chemically-resistant plastic selected independently from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the apparatus according to the present invention, there are at least three gas inlets.

In preferred embodiments of the apparatus according to the present invention, there are at least 60 gas outlets, preferably at least 80 gas outlets, and more preferably at least 100 gas outlets.

In preferred embodiments of the apparatus according to the present invention, gas nozzles are each fitted to a respective gas inlet and configured to connect to a gas supply conduit or manifold.

In preferred embodiments of the apparatus according to the present invention, first additional gas outlets open on a surface of the lid facing inwardly of the closed process chamber, the additional gas outlets being positioned radially inwardly of the annular chamber, the additional gas outlets being oriented so as to generate a rotating gas flow beneath the lid.

In preferred embodiments of the apparatus according to the present invention, second additional gas outlets open on a surface of the lid facing inwardly of the closed process chamber, the second additional gas outlets being positioned radially inwardly of the annular chamber, the additional gas outlets being oriented so as to generate a gas flow directed radially outwardly of the lid.

In another aspect, the present invention relates to a lid for closing a process chamber used for processing wafer-shaped articles. The lid comprises an annular chamber, gas inlets communicating with the annular chamber and opening on an outwardly facing surface of the lid, and gas outlets communicating with the annular chamber and opening on an inwardly facing surface of the lid.

In preferred embodiments of the lid according to the present invention, the lid comprises an upper plate formed from a composite fiber-reinforced material and a lower plate formed from a chemically-resistant plastic, the annular chamber being formed in the lower plate.

In preferred embodiments of the lid according to the present invention, the annular chamber is defined by a radially-inwardly extending groove formed in a lower region of the lid, and a ring that is fitted in an outer part of the groove so as to close the annular chamber.

In preferred embodiments of the lid according to the present invention, the annular chamber is defined by a radially-inwardly extending groove formed in a peripheral region of the lower plate, and a ring that is fitted in an outer part of the groove so as to close the annular chamber.

In preferred embodiments of the lid according to the present invention, the lower region of the lid and the ring are each formed from a region chemically-resistant plastic selected independently from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In preferred embodiments of the lid according to the present invention, there are at least three gas inlets.

In preferred embodiments of the lid according to the present invention, there are at least 60 gas outlets, preferably at least 80 gas outlets, and more preferably at least 100 gas outlets.

In preferred embodiments of the lid according to the present invention, gas nozzles are each fitted to a respective gas inlet and configured to connect to a gas supply conduit or manifold.

In preferred embodiments of the lid according to the present invention, first additional gas outlets open on the inwardly facing surface of the lid, the first additional gas outlets being positioned radially inwardly of the annular chamber, the first additional gas outlets being oriented so as to generate a rotating gas flow beneath the lid.

In preferred embodiments of the lid according to the present invention, second additional gas outlets open on the inwardly facing surface of the lid, the second additional gas outlets being positioned radially inwardly of the annular chamber, the second additional gas outlets being oriented so as to generate a gas flow directed radially outwardly of the lid.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
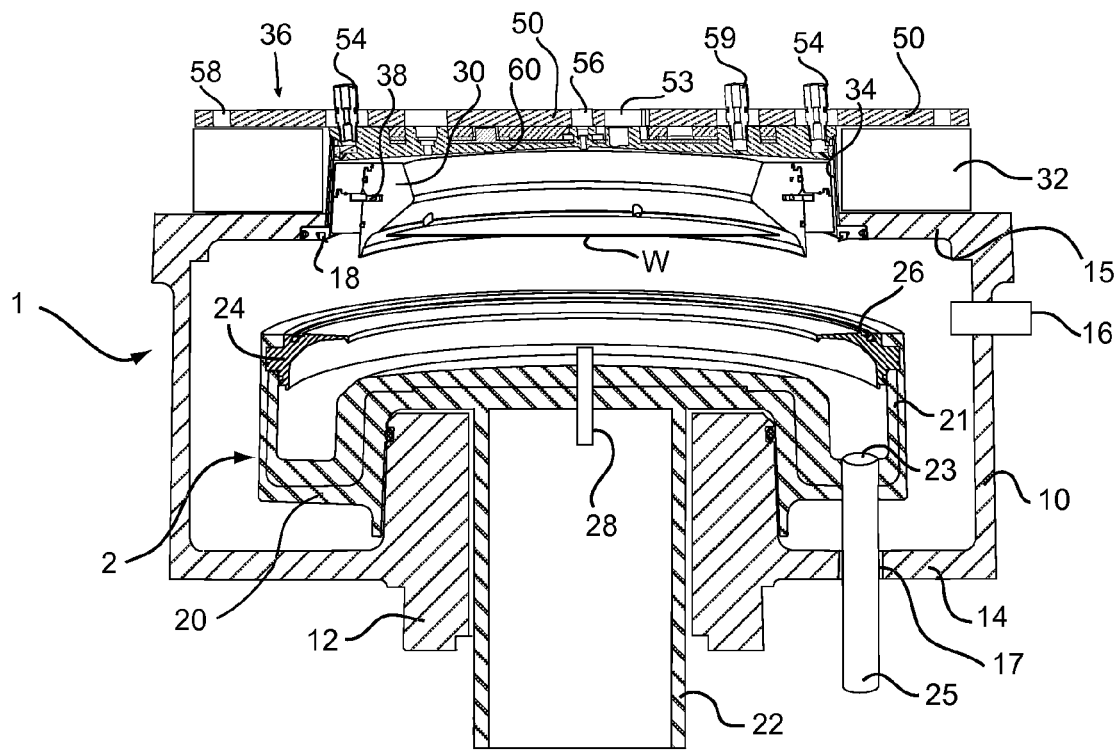
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 32 serve as a motor by which the ring rotor 30 (and thereby a supported wafer W) may be rotated through an active magnetic bearing. For example, the stator 32 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 is of an improved design, and comprises an upper plate 50 formed from a composite fiber-reinforced material and a lower plate 60 that faces into the process chamber and is formed from a chemically-resistant plastic, which in this embodiment is ECTFE. Sandwiched between the upper plate 50 and lower plate 60 in this embodiment is a stainless steel plate 70 (see FIG. 3).

Figure 3:
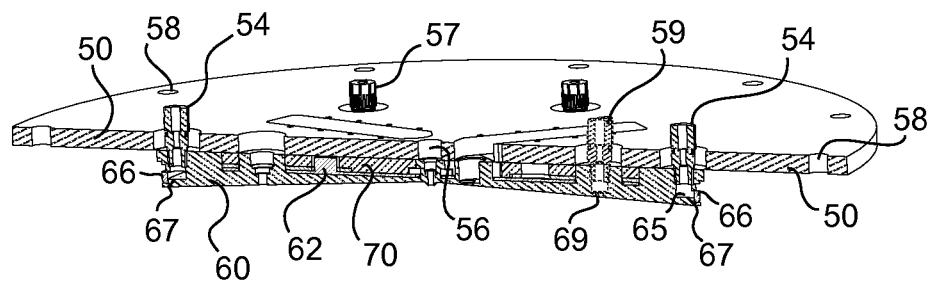
FIG. 3 is sectional perspective view of an embodiment of a lid according to the present invention.
Figure 4:
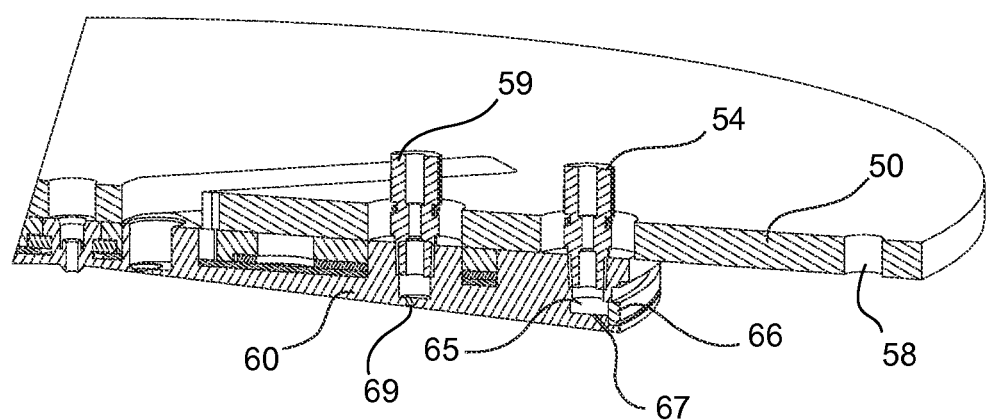
FIG. 4 shows a part of FIG. 3 on a larger scale.
Figure 5:
FIG. 5 is a side view of the lower plate 60 of the preceding embodiment.

As can be seen in FIG. 3, the lid 36 may further include an electrical heating layer 62 for heating the lower plate 60 to a temperature that prevents condensation of process vapors from occurring on the surface of plate 60 that faces into the process chamber. Electrical heating layer 62 is preferably a silicone rubber heater.

Spacer plate 64 serves to maintain the heater layer 62 pressed into contact with lower plate 60, as does the annular spacer 66, which latter element is preferably formed from stainless steel.

Lid 36 may be secured to the process chamber by bolts (not shown) that pass through bores 58.

Referring now to FIGS. 4-7, the lower plate 60 of lid 36 is formed with a radially inwardly extending annular groove 65 that opens on the periphery of plate 60. A ring 66 is fitted in the opening of that groove 65, to form an annular chamber. Upper openings in the plate 60 communicate with the annular chamber, and receive nozzles 54 that are attached to a gas supply so as to supply purge gas into the annular chamber. Preferably there are at least three such nozzles 54.

Figure 6:
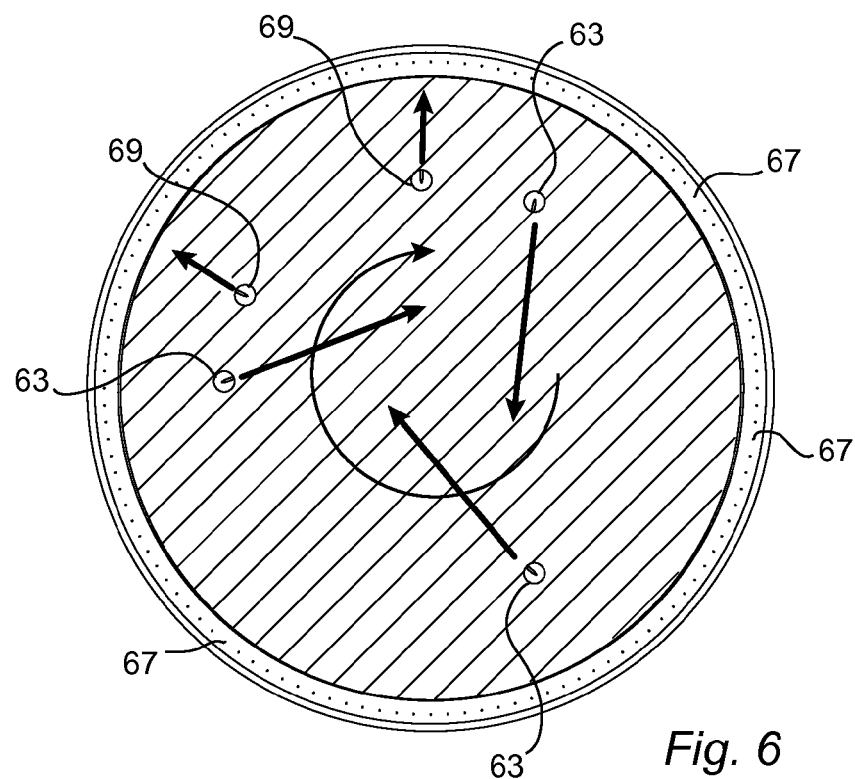
FIG. 6 is a sectional view taken along the line VI-VI of FIG. 5.
Figure 7:
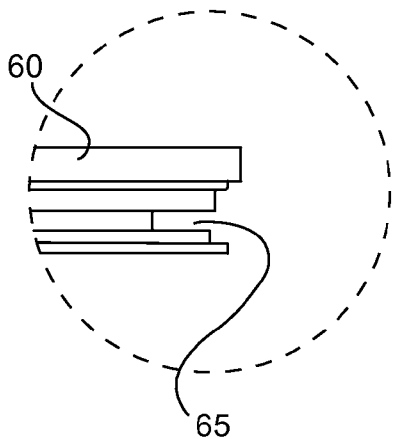
FIG. 7 is an enlarged view of the detail VII in FIG. 5.

Purge gas exits the annular chamber through a much larger number of much smaller outlets 67 that extend from the annular chamber and open on the lower surface of lower plate 60, which is a surface that faces inwardly of the closed process chamber when the lid is in place. As shown in FIG. 6, there are 120 outlets 67 in this embodiment, although the number of such outlets can of course be varied as desired to create a target gas flow profile.

First additional gas outlets 63 also open on the lower surface of lower plate 60, but are positioned radially inwardly of the annular chamber. Outlets 63 are supplied by separate gas nozzles 57. Second additional gas outlets 67 also open on the lower surface of lower plate 60, and, like the first additional outlets 63, are positioned radially inwardly of the annular chamber. These second additional gas outlets 63 are likewise supplied by separate gas nozzles 59.

With reference to FIG. 6, it can be seen that the outlets 63 are moreover oriented so as to generate a rotating gas flow beneath said lid. In particular, the three outlets 63 together generate a flow of purge gas that rotates in a generally clockwise direction, as indicated by the circular arrow in FIG. 6.

On the other hand, the stator 32 and rotor 30 operate to rotate the chuck in a counter-clockwise direction. The opposite directions of rotation as between the chuck and the flow of purge gas through outlets 63 has been found to provide an especially thorough and efficient purging of the chuck ambient within the closed process chamber, especially in the region above the wafer W.

That effect can be further improved by the provision of the second additional outlets 69, which direct their flow of purge gas radially outwardly of the lower plate 60, yet are also positioned inwardly of the annular chamber formed in plate 60.

Simulations were performed to compare the performance of the lid design as described herein with the purge ring of the commonly-owned copending application U.S. Pub. No. 2013/0134128. For wafers of 300 mm diameter rotated at speeds of 350 or 400 rpm, it was found that flow patterns of purge gas having improved velocity and uniformity could be obtained with the present design despite specifying much lower total flow rates of purge gas.

For example, with total flow rate of gaseous nitrogen of 40 liters per minute (lpm) or 75 lpm, the flow pattern was improved in relation to the previous design at flow rates of 120 lpm. In the present design, a flow rate of 40 lpm is obtained by specifying 25 lpm flow through the outlets 67 and 15 lpm flow through the additional outlets 63, 69, and a flow rate of 75 lpm is obtained by specifying 50 lpm flow through the outlets 67 and 25 lpm flow through the additional outlets 63, 69.

Figure 2:
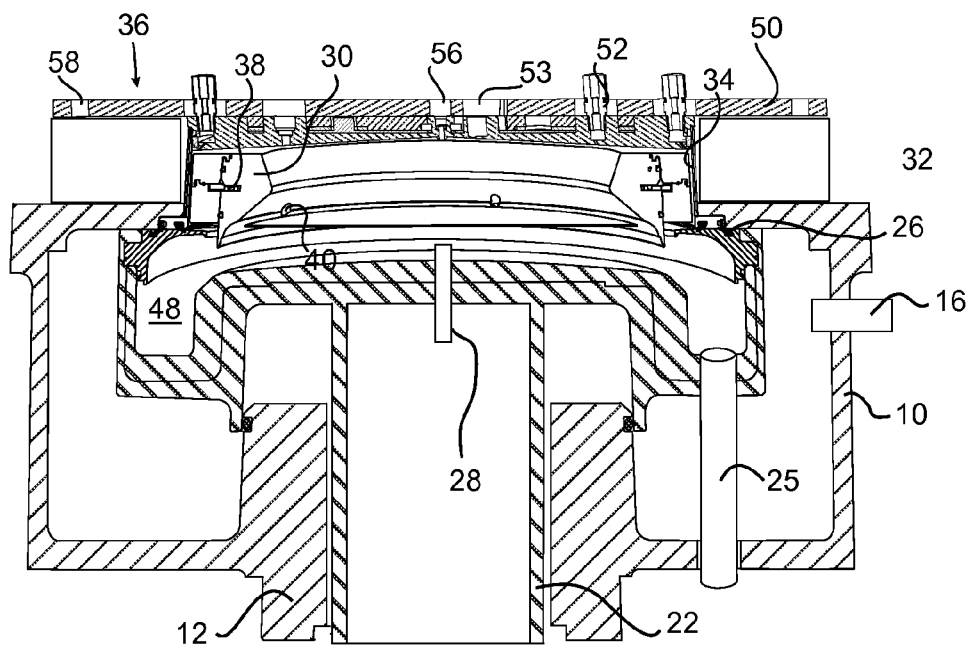
FIG. 2 is an explanatory cross-sectional side view of a process chamber according to the first embodiment of the invention, with the interior cover shown in its second position.

With reference to FIGS. 1 and 2, it will be noted that the wafer W in the foregoing embodiments hangs downwardly from the rotary chuck 30, supported by the gripping members 40, such that fluids supplied through inlet 56 would impinge upon the upwardly facing surface of the wafer W.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, and is connected to a suitable exhaust conduit.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of the exhaust port 46 opening into the chamber 48, independently from the exhaust port 16 that serves the chamber 1 in general, and the remainder of the chamber 1 in the FIG. 2 configuration.

During processing of a wafer, processing fluids may be directed through medium inlets 56 and/or 28 to a rotating wafer W in order to perform various processes, such as etching, cleaning, rinsing, and any other desired surface treatment of the wafer undergoing processing.

Provision of the inner chamber 48 within the overall process chamber 1 thus enhances the safety of environmentally closed chambers by permitting the gases and liquids used for wafer processing to be better isolated from the exterior environment of the process chamber, and reduces the risk of process gas, chemical fumes, hot vapor such as vaporized isopropyl alcohol, ozone and the like being released to the tool environment.

It will be understood that the foregoing description and specific embodiments shown herein are merely illustrative of the invention and the principles thereof, and that modifications and additions may be easily made by those skilled in the art without departing from the spirit and scope of the invention, which is therefore understood to be limited only by the scope of the appended claims.

What is claimed is:

1. Apparatus for processing wafer-shaped articles, comprising:
   a closed process chamber, said closed process chamber comprising a housing providing a gas-tight enclosure;
   a rotary chuck located within said closed process chamber, said rotary chuck being adapted to hold a wafer shaped article thereon; and
   a lid secured to an upper part of said closed process chamber, said lid comprising
      an annular groove formed in an outer perimeter of the lid,
      a ring fitted in the groove to form an annular chamber, wherein the annular chamber is defined by the groove and the ring,
      openings communicating with said annular chamber and opening on a surface of the lid facing outwardly of the closed process chamber, said openings configured to receive respective gas nozzles, and
      gas outlets communicating with said groove and extending downward from said groove to open on a surface of the lid facing inwardly of said closed process chamber, wherein said gas outlets traverse a lower wall of said lid and open into said process chamber beneath said lid to provide fluid communication between said process chamber and said annular chamber defined by said groove and said ring.

2. The apparatus according to claim 1, wherein said lid comprises an upper plate formed from a composite fiber-reinforced material and a lower plate that faces into said closed process chamber and is formed from a chemically-resistant plastic, said annular chamber being formed in said lower plate.

3. The apparatus according to claim 1, wherein said groove is formed in a lower region of said lid.

4. The apparatus according to claim 3, wherein said lower region of said lid and said ring are each formed from a chemically-resistant plastic selected independently from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

5. The apparatus according to claim 1, comprising at least three of said openings.

6. The apparatus according to claim 1, comprising at least 60 of said gas outlets.

7. The apparatus according to claim 1, further comprising gas nozzles each fitted to a respective one of said openings and configured to connect to a gas supply conduit or manifold.

8. The apparatus according to claim 1, further comprising first additional gas outlets opening on a surface of the lid facing inwardly of said closed process chamber, said additional gas outlets being positioned radially inwardly of said annular chamber, said additional gas outlets being oriented so as to generate a rotating gas flow beneath said lid.

9. The apparatus according to claim 8, further comprising second additional gas outlets opening on a surface of the lid facing inwardly of said closed process chamber, said second additional gas outlets being positioned radially inwardly of said annular chamber, said additional gas outlets being oriented so as to generate a gas flow directed radially outwardly of said lid.

* * * * *